(12) United States Patent
Goel et al.

(10) Patent No.: US 10,050,591 B2
(45) Date of Patent: Aug. 14, 2018

(54) LC NETWORK FOR A POWER AMPLIFIER WITH SELECTABLE IMPEDANCE

(71) Applicant: Infineon Technologies AG, Neubiberg (DE)

(72) Inventors: Saurabh Goel, San Jose, CA (US); Richard Wilson, Morgan Hill, CA (US); Haedong Jang, San Jose, CA (US)

(73) Assignee: Cree, Inc., Durham, NC (US)

( * ) Notice: Subject to any disclaimer, the term of this patent is extended or adjusted under 35 U.S.C. 154(b) by 63 days.

(21) Appl. No.: 15/078,298

(22) Filed: Mar. 23, 2016

(65) Prior Publication Data

US 2017/0279419 A1 Sep. 28, 2017

(51) Int. Cl.
*H03F 3/19* (2006.01)
*H03F 3/21* (2006.01)
*H03F 1/56* (2006.01)

(52) U.S. Cl.
CPC .............. *H03F 3/19* (2013.01); *H03F 1/565* (2013.01); *H03F 3/21* (2013.01); *H03F 2200/111* (2013.01); *H03F 2200/222* (2013.01); *H03F 2200/252* (2013.01); *H03F 2200/267* (2013.01); *H03F 2200/421* (2013.01); *H03F 2200/451* (2013.01); *H03F 2200/48* (2013.01)

(58) Field of Classification Search
USPC ......................................... 330/302, 305–307
See application file for complete search history.

(56) References Cited

U.S. PATENT DOCUMENTS

| | | | |
|---|---|---|---|
| 8,131,232 B2* | 3/2012 | Muhammad | H04B 1/0458 330/86 |
| 8,253,496 B2* | 8/2012 | Ichitsubo | H03F 3/195 330/136 |

* cited by examiner

*Primary Examiner* — Hieu Nguyen
(74) *Attorney, Agent, or Firm* — Murphy, Bilak & Homiller, PLLC

(57) ABSTRACT

An amplifier is configured to amplify an RF signal as between an input terminal and an output terminal across a wideband frequency range. A first LC network is connected to the input terminal and has first and second reactive components. A first switching device is connected between the first and second reactive components and couples both the first and second reactive components to the input terminal in an ON state, and disconnects the second reactive component from the input terminal in an OFF state. A second LC network is connected to the output terminal and has third and fourth reactive components. A second switching device is connected between the third and fourth reactive components and couples both the third and fourth reactive components to the output terminal in an ON state and disconnects the fourth reactive component from the output terminal in an OFF state.

13 Claims, 7 Drawing Sheets

6A

6B

7B

7A

LC NETWORK FOR A POWER AMPLIFIER WITH SELECTABLE IMPEDANCE

FIELD OF TECHNOLOGY

The present application relates to RF (radio frequency) amplifiers, in particular impedance matching networks for RF amplifiers.

BACKGROUND

RF power amplifiers are used in a variety of applications such as base stations for wireless communication systems etc. The signals amplified by the RF power amplifiers often include signals that have a high frequency modulated carrier having frequencies in the 400 megahertz (MHz) to 4 gigahertz (GHz) range. The baseband signal that modulates the carrier is typically at a relatively lower frequency and, depending on the application, can be up to 300 MHz or higher.

RF power amplifiers are designed to provide linear operation without distortion. Input and output impedance matching circuits are used to match RF transistors that may have low input and output impedances (e.g., around 1 ohm or less for high power devices), to the impedance matching networks of an external device, such as a circuit board.

A device package for an RF power amplifier can include a transistor die (e.g., MOSFET (metal-oxide semiconductor field-effect transistor), LDMOS (laterally-diffused metal-oxide semiconductor), HEMT (high electron mobility transistor) along with an input and output impedance matching circuit incorporated therein. The input and output impedance matching circuits typically include LC networks that provide at least a portion of an impedance matching circuit that is configured to match the impedance of the transistor die to a fixed value.

In general, there is a tradeoff between the broadband capability and power efficiency in RF power amplifier systems. One example of this tradeoff relates to impedance matching between an RF device package and the circuit board that receives and electrically connects to the RF device package. The circuit board typically includes an impedance matching network (or networks) with a fixed impedance value that is paired to the impedance matching network (or networks) of the packaged device so as to effectuate optimum power transfer between the two. However, in the context of RF signals, maximum transfer efficiency is only attainable at one frequency. If operation of the RF amplifier at another frequency is desired, the designer must reconfigure the impedance matching networks, which requires multiple devices with different internal matching topologies, or accept a reduced efficiency. Another example relates to tuning circuits that are configured to filter out harmonic components of the fundamental frequency. Highly efficient operation is only attained when the harmonics of the RF signal are filtered out. This can be done using reactive components that are part of the input and output impedance matching circuits described above. However, these reactive components are tuned to a particular frequency and become less effective as the device is operated outside of this frequency. As a result, the harmonics are not completely tuned out and the power efficiency of the device degrades substantially.

SUMMARY

An amplifier circuit is disclosed. According to an embodiment, the amplifier circuit includes an RF amplifier configured to amplify an RF signal as between an input terminal and an output terminal across a wideband frequency range. The RF amplifier further includes a first LC network connected to the input terminal and having first and second reactive components. A first switching device is connected between the first and second reactive components. The first switching device couples both the first and second reactive components to the input terminal in an ON state, and the first switching device disconnects the second reactive component from the input terminal in an OFF state. The RF amplifier further includes a second LC network connected to the output terminal and having third and fourth reactive components. A second switching device is connected between the third and fourth reactive components. The second switching device couples both the third and fourth reactive components to the output terminal in an ON state. The second switching device disconnects the fourth reactive component from the output terminal in an OFF state.

An RF assembly is disclosed. According to an embodiment, the RF assembly includes a circuit board having an impedance matching network. The RF assembly further includes a device package mounted on the circuit board. The device package includes an RF amplifier configured to amplify an RF signal as between an input terminal and an output terminal of the RF amplifier across a wideband frequency range, a first LC network connected to the input terminal and comprising first and second reactive components, a second LC network connected to the output terminal and comprising third and fourth reactive components, a first package lead connecting the input terminal to the circuit board, and a second package lead connecting the output terminal to the circuit board. The RF assembly further includes a first switching device configured to select an impedance of the first LC network between a first impedance value and a second impedance value; and a second switching device configured to select an impedance of the second LC network between a third impedance value and a fourth impedance value. The impedance matching network is connected to the first package lead or the second package lead.

A method of operating an amplifier circuit is disclosed. According to an embodiment, the method includes using an RF amplifier to amplify an RF signal as between an input terminal and an output terminal across a wideband frequency range, selecting an impedance value of a first LC network that is coupled to the input terminal between a first impedance value and a second impedance value, and selecting an impedance value of a second LC network that is coupled to the output terminal between a third impedance value and a fourth impedance value. Selecting the impedance value of the first LC network includes controlling an ON/OFF state of a first switching device. Selecting the impedance value of the second LC network includes controlling an ON/OFF state of a second switching device.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 4A and 4B, illustrates a power back off (PBO) for an amplifier with an LC network operated at a second frequency. In FIG. 4A, the LC network is tuned to the first frequency. In FIG. 4B, the LC network is tuned to the second frequency.

FIGS. 6A and 6B, illustrates an efficiency comparison of an RF assembly that is reconfigured to match the impedance of the LC networks to a fixed value at two different fundamental frequencies.

FIGS. 7A and 7B, illustrates an efficiency comparison of an RF assembly that is reconfigured to match the impedance of the LC networks to a fixed value at two different fundamental frequencies.

DETAILED DESCRIPTION

Embodiments described herein include an RF amplifier (e.g., a GaN based transistor) with impedance-adjustable first and second first LC networks coupled to the input and output (e.g., gate and drain) terminals of the RF amplifier. The first and second first LC networks are impedance-adjustable insofar as the impedance presented by these networks can be changed by control signaling. The adjustability is made possible by the incorporation of switching devices into the first and second first LC networks. By adjusting the conduction state of these switching devices (i.e., the ON/OFF) state, the number of reactive elements coupled to the RF amplifier can be changed. For example, each LC network can include two capacitors in parallel with one another. Turning a switching device ON couples both of the capacitors to a terminal of the RF amplifier and turning the switching device OFF disconnects one of the two capacitors from the respective terminal of the RF amplifier.

Advantageously, the impedance adjustability of the first and second LC networks enhances the adaptability and bandwidth response of the device in comparison to prior art techniques, which utilize fixed value LC networks. For example, both of the first and second first LC networks may be configured to resonate (i.e., provide an RF short) at two different second order harmonic frequencies (e.g., 3.6 GHz and 5.4 GHz, wherein 1.8 GHz and 2.7 GHz represent the fundamental frequency), responsive to the control signal that is applied to the switching devices. In this way, the RF amplifier can be operated at either one of the fundamental frequencies at high efficiency, with the second order harmonics being perfectly filtered out in each case. As another example, impedance adjustability of the first and second LC networks may be used to maximize power transfer as between a device package and a circuit board at two different operating frequencies (e.g., 1.8 GHz and 2.2 GHz). In this way, a single packaged device can be produced that is compatible with a circuit board having a fixed value impedance matching network and can be operated at maximum efficiency for the two different operating frequencies.

Figure 1:
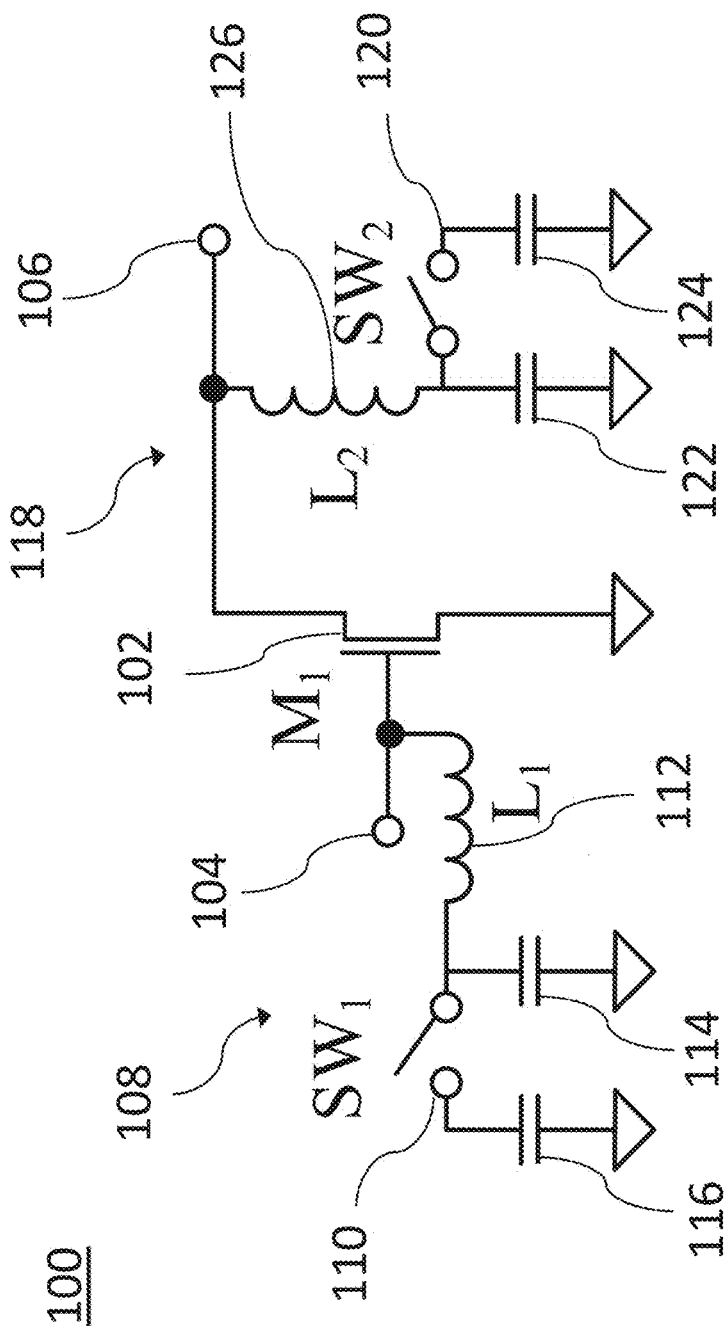
FIG. 1 illustrates an amplifier circuit, according to an embodiment.

Referring to FIG. 1, an amplifier circuit 100 is depicted. The amplifier circuit 100 includes an RF amplifier 102 configured to amplify an RF signal as between an input terminal 104 and an output terminal 106. In various embodiments, the RF amplifier 102 can be a power transistor such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc. and more generally any type of RF transistor device. The RF amplifier 102 and the complete amplifier circuit 100 can be a multi-carrier amplifier, a multiband amplifier, an LTE (long term evolution) compliant amplifier, a WCDMA (wideband code division multiple access) compliant amplifier, an 802.11(x) compliant amplifier, etc.

The amplifier circuit 100 is configured to operate in a wideband frequency range. In contrast to narrowband, wideband refers to the fact that the range of frequency values for the RF signal exceed the coherence bandwidth of a single channel. The amplifier circuit 100 provides, within acceptable tolerances, the same characteristics across the wideband frequency range. The wideband frequency range can span at least 10% of a center frequency (e.g., 1.8 GHz to 2.2 GHz, wherein the center frequency is 2.0 GHz) and can span 20% of a center frequency or more. These values represent just one example, and the wideband frequency range is scalable other frequencies.

The amplifier circuit 100 further includes a first LC network 108 connected to the input terminal 104 of the RF amplifier 102. The first LC network 108 includes at least two reactive components (i.e., capacitors and inductors) and a first switching device 110 connected between the two reactive components. The first switching device 110 and the reactive components are connected to the input terminal 104 of the RF amplifier 102 by a conductive connection. As a result, the first LC network 108 presents an impedance to the input terminal 104 of the RF amplifier 102. Moreover, the first LC network 108 is configured in such a manner that the impedance presented to the input terminal 104 of the RF amplifier 102 can be changed, depending on the switching state of the first switching device 110.

According to an embodiment, the conductive connection between the first switching device 110, the reactive components and the input terminal 104 of the RF amplifier 102 is provided by a first inductor 112. The first inductor 112 may be provided using an inductive bond wire, for example. The first inductor 112 forms a direct electrical connection. Alternatively, other intervening circuit elements (switches, capacitors, etc.) may be provided between the two. Moreover, the conductive connection can be provided by other connection means. For example, the conductive connection can be a metallization trace, such as a PCB trace. The inductance of the conductive connection can be tailored to achieve a desired inductance.

In the depicted embodiment, the first LC network 108 includes first and second capacitors 114, 116. The first switching device 110 is directly connected to first terminals (e.g., positive terminals) of the first and second capacitors 114, 116. The second terminals (e.g., negative terminals) of the first and second capacitors 114, 116 are connected to a reference potential (i.e., GND). When the first switching device 110 is in the ON state, the first and second capacitors 114, 116 are both coupled to the input terminal 104 via the first inductor 112. Moreover, the first and second capacitors 114, 116 are arranged in a parallel configuration such that the capacitance seen by the input terminal 104 includes the sum of the capacitances of the first and second capacitors 114, 116. When the first switching device 110 is in the OFF state, the second capacitor 116 is disconnected from the input terminal 104 of the RF amplifier 102. In this configuration, the impedance seen by the input terminal 104 includes the inductance of the first inductor 112 and the capacitance of the first capacitor 114, but does not include the capacitance of the second capacitor 116.

The embodiment of FIG. 1 represents one example of an amplifier circuit with adjustable impedance. The adjustable impedance principle described above can be applied in any of a variety of circuit configurations. For example, the first LC network 108 can optionally include three, four, five, etc. capacitors arranged in a parallel configuration with switching devices connected between each capacitor. In this way, the first LC network 108 can have a wider range of impedance values and/or finer granularity between impedance values. Likewise, the switching devices can be provided between parallel connected inductors such that the inductance seen by the input terminal 104 of the RF amplifier 102 is adjustable.

The first switching device 110 can be any kind of electrical switch, including a transistor. According to an embodiment, the first switching device 110 is a mechanical switching device. As used herein, a mechanical switching device describes any device that physically completes a connection with an electrical conductor and removes the connection by physically disconnecting the electrical conductor. By way of comparison, a semiconductor transistor provides an electrical connection by controlling the conductive state of a doped semiconductor region. One example of a mechanical switching device is a MEMS switch that is configured to mechanically deflect a cantilever, based upon an input voltage. Other examples of mechanical switching devices include fuses. One advantage of configuring the first switching device 110 as a mechanical switching device is that the switching state is not dependent upon the voltage present at the output terminals of the first switching device 110. In the circuit of FIG. 1, this characteristic is advantageous because the voltage present at the positive terminals of the first and second capacitors 114, 116 can vary, depending on the charging state of these devices.

According to an embodiment, the first switching device 110 is a one-time-programmable (OTP) switch, such as a fuse or nanotube. In some applications, the impedance of the first LC network 108 only needs to be set once (e.g., during device assembly in test). In that case, an OTP switch is suitable. In other applications, the RF amplifier 102 is operated at different frequencies and the impedance of the first LC network 108 can be accordingly adjusted. In that case, a switching device that can be repeatedly switched (e.g., a MEMS switch) is required.

The amplifier circuit 100 includes a second LC network 118 connected to the output terminal 106 of the RF amplifier 102. The second LC network 118 may be configured substantially similar to the first LC network 108 described above. As a result, an output impedance of the amplifier circuit 100 can be adjusted by operating a second switching device 120 that is connected between a pair of reactive components in the second LC network 118. For example, the second LC network 118 may include third and fourth capacitors 122, 124, wherein both of the third and fourth capacitors 122, 124 are coupled to the output terminal 106 of the RF amplifier 102 in the ON state of the second switching device 120, and wherein the fourth capacitor 124 is disconnected form the output terminal 106 of the RF amplifier 102 in the OFF state of the second switching device 120. The second LC network 118 likewise includes a conductive connection between the second switching device 120, the third and fourth capacitors 122, 124, and the output terminal 106 of the RF amplifier 102. According to an embodiment, this conductive connection is provided by a second inductor 126, which may be provided by an inductive bond wire.

The specific parameter values of the second LC network 118 (i.e., inductance and capacitance of the elements) may be, but are not necessarily, identical to the specific parameter values of the first LC network 108. Further, the topology of the second LC network 118 may be, but is not necessarily, identical to the topology of the first LC network 108. In a similar manner as described above, the second LC network 118 can include any number of capacitors and/or inductors with switching devices interposed between each element.

Figure 2:
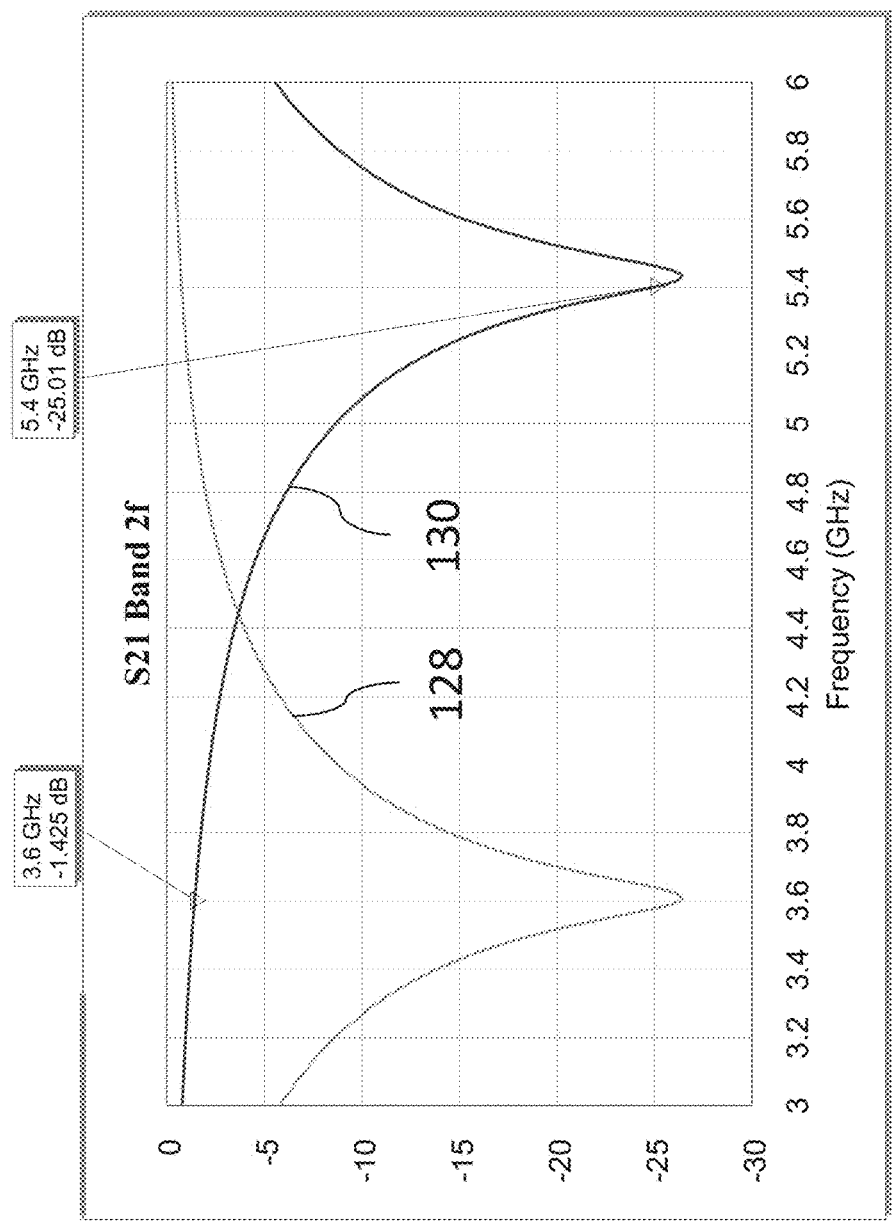
FIG. 2 illustrates S21 plots for an amplifier output matching network at second order harmonic values, according to an embodiment.

Referring to FIG. 2, two S21 plots are shown for an amplifier output matching network being operated at different frequencies. A first plot 128 represents an S21 a nominal second order frequency response for an amplifier output matching network being operated at a lower frequency of 1.8 GHz. A second plot 130 represents an S21 a second order frequency response for an amplifier output matching network being operated at a second frequency of 2.7 GHz. The amplifier may be a class F amplifier, for example. Nominally, a class F amplifier should present a short circuit to even order harmonics, and specifically at least the second order harmonic. Furthermore, nominally, a class F amplifier should present an open circuit to odd order harmonics, and specifically at least the third order harmonic. This provides square voltage waveform and half sinusoidal current waveform.

The first S21 plot 128 requires a very low impedance of approximately −26 dB at the second harmonic (i.e., 3.6 GHz) of the first lower frequency of 1.8 GHz and a very high impedance of approximately −1 dB at the third harmonic (i.e., 5.4 GHz). The second S21 plot 130 requires a very low impedance of approximately −26 dB at the second harmonic of the second higher frequency of 2.7 GHz (i.e., 5.4 GHz). Thus, it is not possible to provide the necessary frequency response for both of the first and second frequencies using an LC network with fixed impedance values. In that case, the LC network can only be tuned to the lower or higher frequency.

Figure 3:
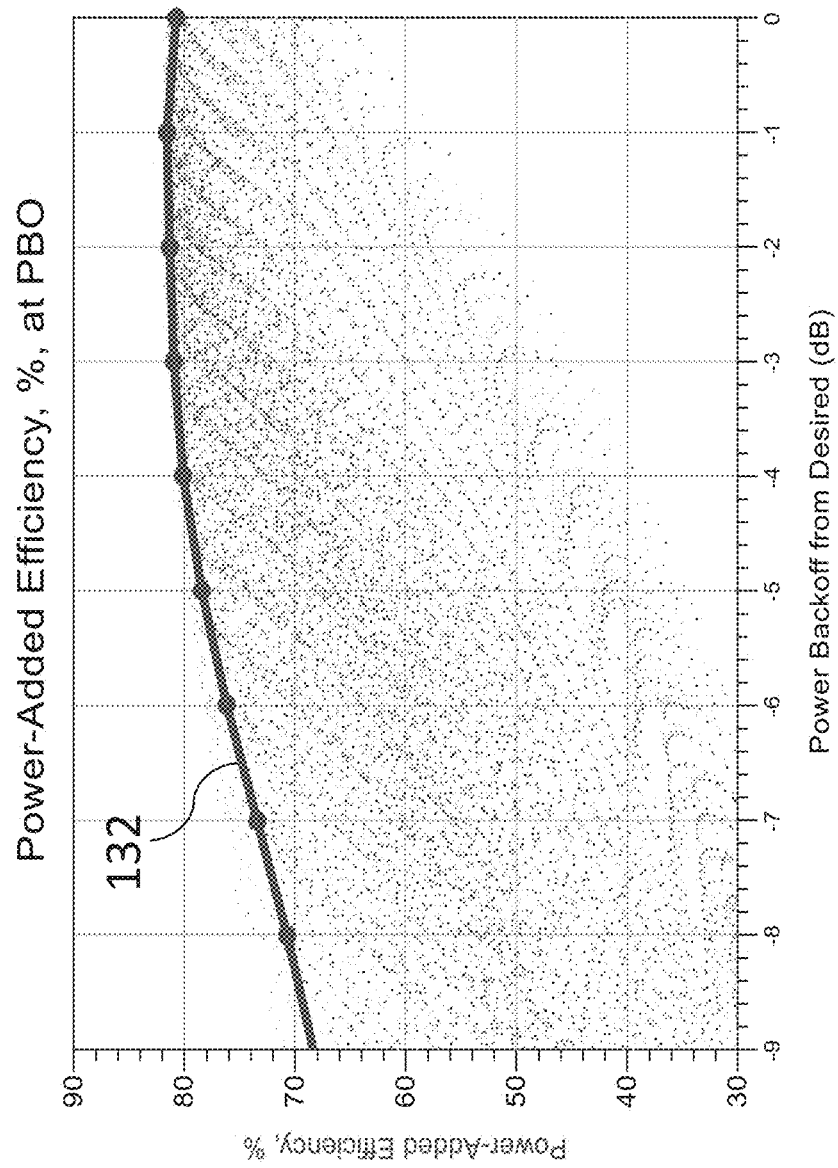
FIG. 3 illustrates a power back off (PBO) for an amplifier with an LC network tuned to a first frequency and operated at the first frequency, according to an embodiment.

Referring to FIG. 3, the power efficiency back-off (PBO) plot for an amplifier circuit being operated at 2.7 GHz is depicted. In this embodiment, the amplifier circuit includes LC networks that are tuned to provide a class F frequency response at an operational frequency of 2.7 GHz. More particularly, the amplifier circuit includes an RF amplifier with a first LC network connected to the input terminal of the RF amplifier and a second LC network connected to the output terminal of the RF amplifier. Both of the first and second LC networks 108, 118 have a capacitance of 1.24 pF (picofarads) and an inductance of 0.7 nH (nanoHenrys). These parameters produce an LC circuit that resonates at twice the operational frequency of 2.7 GHz (i.e., the second order harmonic). Various PBO values are plotted from different starting points and different back off amounts. The uppermost line 132 represents the maximum possible efficiency for each PBO. As can be seen, the efficiency trends downward at greater PBO. However, an efficiency of at least 70% is maintained through a PBO of −8 dB.

Figure 4:
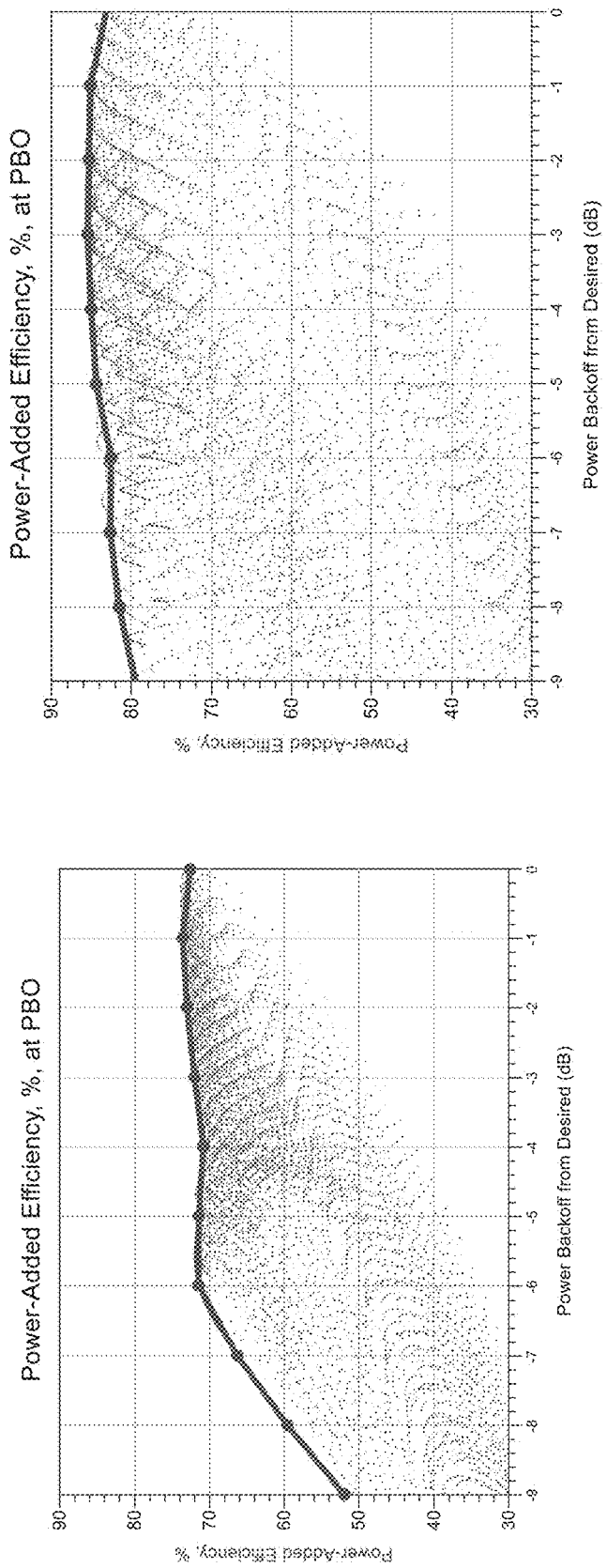
FIG. 4, which includes

Referring to FIG. 4, two power efficiency back-off (PBO) plots are shown for an amplifier circuit being operated at 1.8 GHz. FIG. 4A depicts the PBO for an amplifier circuit with the same parameter values as described above (i.e., 1.24 pF and 0.7 nH) used in the first and second LC networks 108, 118. FIG. 4B depicts the PBO for an amplifier circuit with parameter values for in the first and second LC networks 108, 118 that are tuned resonate with the lower operating frequency of 1.8 GHz. Specifically, the amplifier circuit of FIG. 4B has capacitance of 2.61 pF and an inductance of 0.7 nH.

As can be seen, a dramatic improvement in the maximum PBO can be realized by tailoring the resonance of the first and second LC networks 108, 118 accordingly. Whereas the efficiency of the circuit of FIG. 4A (i.e., the circuit that is tuned to an operational frequency of 2.7 GHz) drops below 60% at a PBO of −8 dB, the efficiency of the circuit of FIG. 4B (i.e., the circuit that is tuned to an operational frequency of 1.8 GHz) is maintained above 80% at a PBO of −8 dB. In the example of FIG. 4, the second order harmonic of the operating frequency is tuned out by the first and second LC networks 108, 118. The same principle may be used to tune out higher order harmonics (i.e., third, fourth, fifth, etc.) using the first and second LC networks 108, 118.

FIG. 4 illustrates one way that the circuit described with reference to FIG. 1 can be used to improve efficiency across a wideband frequency range. Due to the selectable impedance of the first and second LC networks 108, 118, the circuit designer does not need to select a fixed impedance value and suffer from the decreased performance at one frequency value, as is shown by a comparison of FIGS. 3 and 4A. Instead, the user can obtain the benefit high efficiency at both frequency values, as is shown by a comparison of FIGS. 3 and 4B. In other words, a high efficiency class F frequency response for two different frequency values can be obtained by appropriately selecting the parameter values for the capacitors and inductors in the first and second LC networks 108, 118. More particularly, the parameter values can be set such that, when the switching device is OFF, the first and second LC networks 108, 118 have a resonant frequency of two times the higher frequency, and such that, when the switching device is ON, the first and second LC networks 108, 118 have a resonant frequency of two times the lower frequency.

Figure 5:
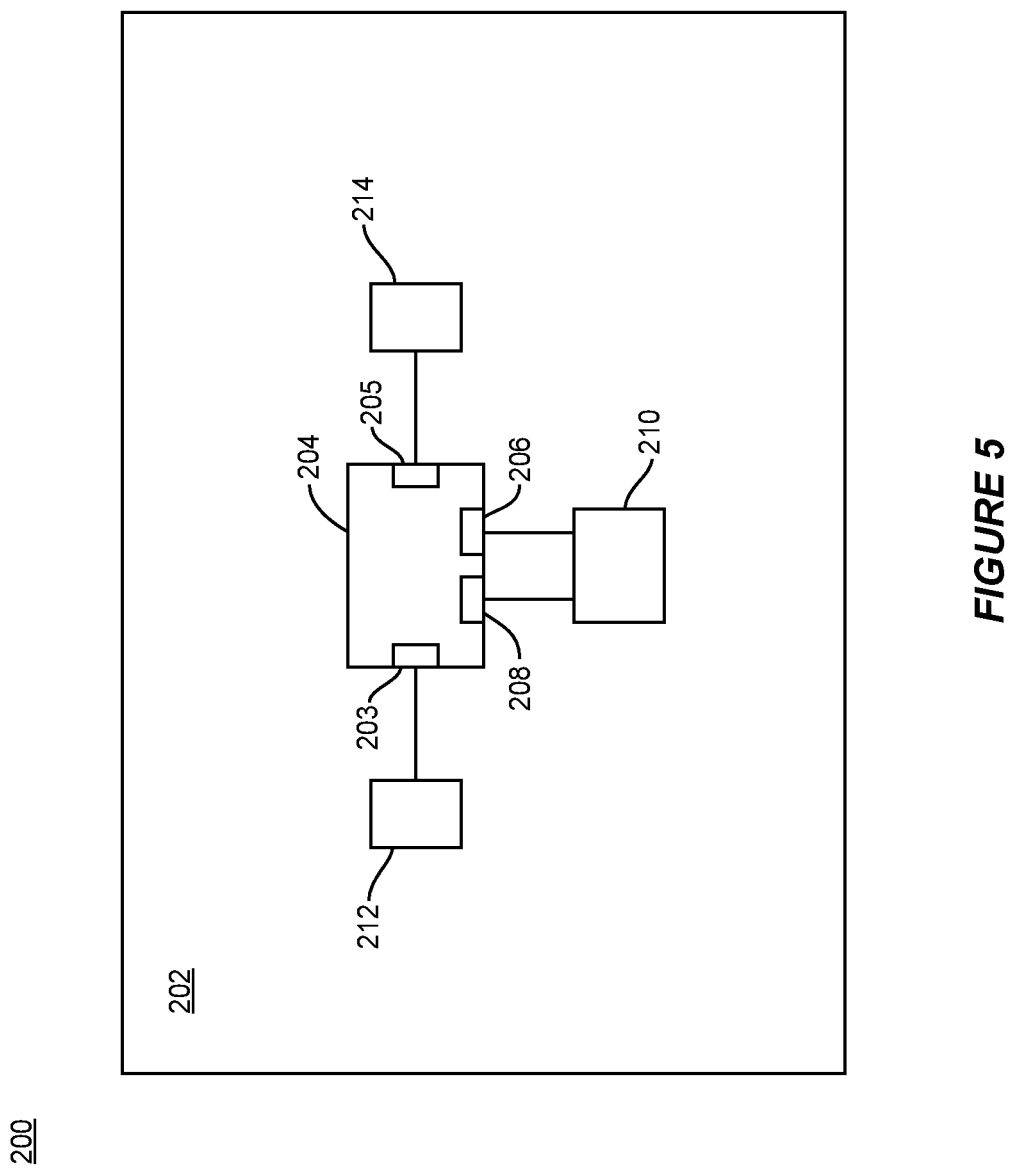
FIG. 5 illustrates an RF assembly that includes a circuit board and a device package, according to an embodiment.

Referring to FIG. 5, an RF assembly 200 that includes the amplifier circuit 100 described with reference to FIG. 1 is depicted, according to an embodiment. The RF assembly 200 includes a circuit board 202 (e.g., a PCB) that is configured to support and electrically connect with multiple electronic components. A device package 204 is mounted on the circuit board 202. The device package 204 includes the RF amplifier 102 and at least a part of the first and second LC networks 116, 118 described with reference to FIG. 1. The device package 204 includes a first package lead 203 connecting the input terminal 104 of the RF amplifier 102 to the circuit board 202 and a second package lead 205 connecting the output terminal 106 of the RF amplifier 102 to the circuit board 202.

According to one embodiment, the device package 204 includes a metal flange, the RF amplifier 102 is a transistor die mounted on the flange, and the first and second LC networks 108, 118 are provided by a plurality of chip capacitors and inductive bond wires mounted to the flange. The flange includes two package level leads that connect the input terminal 104 and the output terminal 106 of the RF amplifier 102, respectively, to the circuit board 202. A general description of such a structure is described in U.S. application Ser. No. 12/817,869 to Blair, the content of which is incorporated by reference in its entirety. Alternatively, the device package 204 can be a PCB based package in which the package leads are formed from PCB. Reactive components, such as the first, second, third and fourth capacitors 122, 124 described herein can be embedded within the PCB. A general description of such a structure is described in U.S. application Ser. No. 14/811,325 to Mu, the content of which is incorporated by reference in its entirety. The first and second switching devices 110, 120 may be incorporated into the device package 204, e.g., as discrete chip components and connected to the device package 204 using package level interconnect (e.g., bond wires, metal trace, etc.). That is, the complete circuit as illustrated in FIG. 1 can be incorporated in the device package 204. Alternatively, the first and second switching devices 110, 120 can be externally provided on the circuit board 202, and can connect to the reactive components through I/O connections.

The ON/OFF state of the first and second switching devices 110, 120 can be independently controlled via the circuit board 202. Thus, the impedance of the first and second LC networks 108, 118 is adjustable by appropriate control signalling that is applied from and/or generated by the circuit board 202. In the embodiment of FIG. 5, the device package 204 includes a third and fourth leads 206, 208 that independently connect to the inputs of the first and second switching devices 110, 120. Alternatively, the inputs of the first and second switching devices 110, 120 can be connected to the first and second package leads, 203, 205, respectively, and the ON/OFF state of the first and second switching devices 110, 120 can be controlled by a DC bias that applied on top of the RF signal at the first and second package leads, 203, 205. The control signalling is provided by a device 210 that is mounted on and electrically connected to the circuit board 202. Alternatively, the first and second switching devices 110, 120 can be externally controlled. According to another embodiment, a controller device that is configured to control the first and second switching devices 110, 120 can be incorporated into the device package 204.

According to an embodiment, the circuit board 202 includes impedance matching networks that are configured to match the impedance seen at the first and second package leads 203, 205 to a predetermined value, e.g., 50 ohms. More particularly, the circuit board 202 may include a first impedance matching network 212 that connects to the first package lead 203 and a second impedance matching network 214 that is connected to the second package lead 205.

Figure 6:
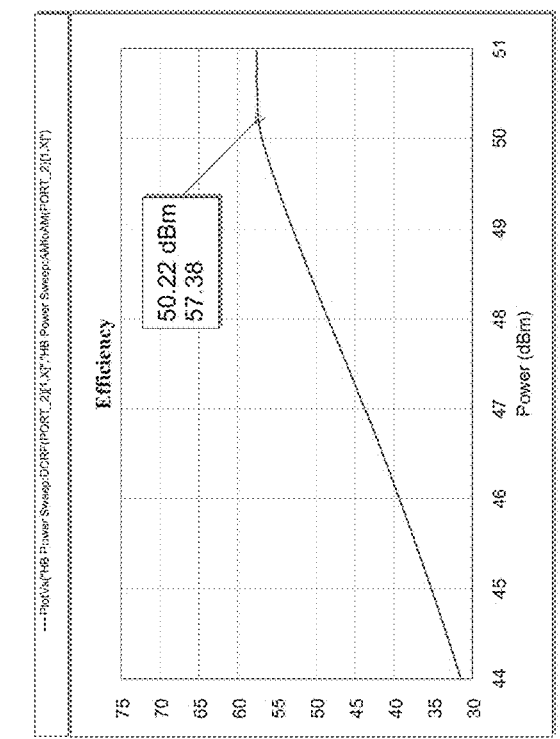
FIG. 6, which includes
Figure 6:
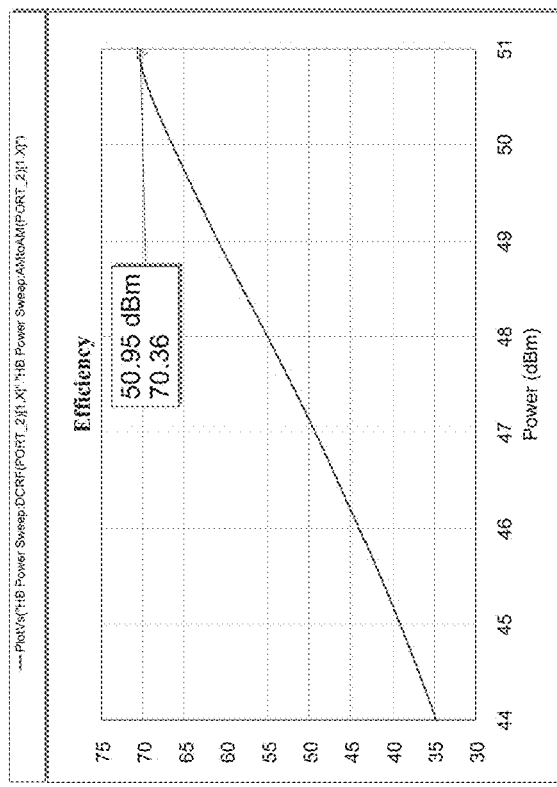

Referring to FIG. 6, an efficiency comparison of the RF assembly 200 is depicted, wherein the first and second LC networks 108, 118 are used as impedance matching networks. As those having ordinary skill appreciate, power transfer and efficiency depends upon the impedance matching between the source impedance and the load impedance. Typically, ports are matched to a standard value (e.g. 50 ohms) so as to ensure that each transmission path is balanced and power is not wasted. In the context of RF signals, the reactive component of power must also be balanced. This is typically done by providing LC networks at the input and output ports of each device in the system. However, maximum power transfer is only achievable at a single frequency. As the circuit is operated further away from this frequency, the efficiency and power transfer of the circuit drops. This principle is illustrated in FIGS. 6A and 6B.

FIG. 6A depicts the efficiency of the RF assembly 200 with the RF amplifier 102 being operated at 1.8 GHz. In this example, the RF assembly 200 includes the first impedance matching network 212 that is connected to the first LC network 108 via the first package lead 203 and the second impedance matching network 214 that is connected to the second LC network 118 via the second package lead 205. The first and second impedance matching networks 212, 214 and the first and second LC circuits 110, 118 are perfectly balanced at 1.8 GHz. At the 1.8 GHz operation point, the system is approximately 70% efficient at a power level of 50 dBM.

FIG. 6B depicts the same circuit being operated at 2.2 GHz. In this example, the impedance values of the first and second impedance matching networks 212, 214 and the first and second LC circuits 110, 118 remain the same. As can be seen, at the 2.2 GHz operation point, the system is approximately 57% efficient at a power level of 50 dBM. Thus, a substantial amount of efficiency is lost due to the non-optimal load impedance presented to the device.

Figure 7:
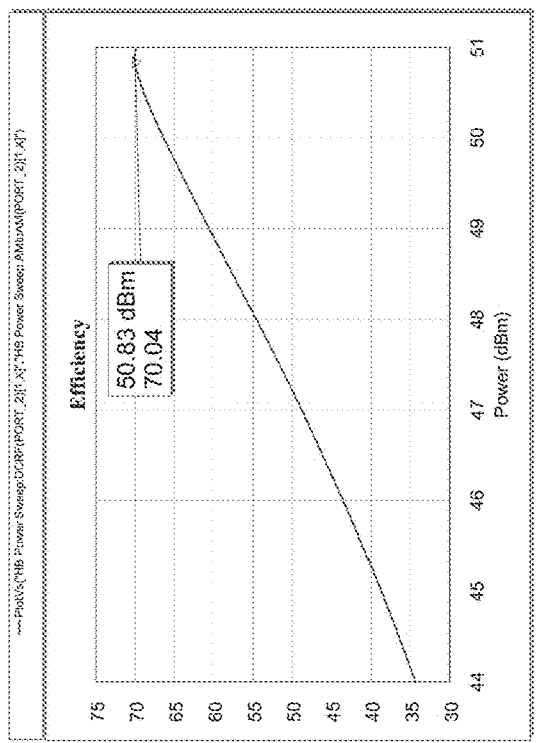
FIG. 7, which includes
Figure 7:
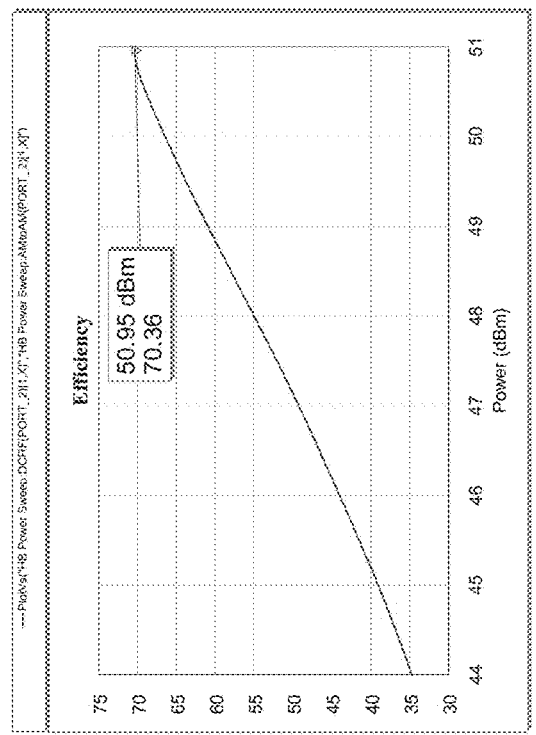

Referring to FIG. 7, an efficiency comparison of the RF assembly 200 is depicted. Different to the example of FIG. 5, in this case, the impedance values of the first and second LC circuits 110, 118 have been adjusted using the circuits and techniques described herein. That is, the first and second switching devices 110, 120 have been operated to adjust the impedance of the first and second LC circuits 110, 118 to different values. In this way, the amplifier circuit 100 is used to provide optimum power transfer to enable full use of available current and voltage swing at both operating frequencies. More particularly, FIG. 7A depicts the efficiency of the RF assembly 200 with the RF amplifier 102 being operated at 1.8 GHz under the same conditions described with reference to FIG. 6A. FIG. 7B depicts the efficiency of RF assembly 200 with the impedance values of the first and second LC networks 108, 118 being adjusted to a value that corresponds to a maximum power transfer at the second frequency (i.e., 2.2 GHz). In this case, the system has the same efficiency of approximately 70% efficient at a power level of 50 dBm for both operating points.

As can be seen, by using the circuits and methods described herein, the impedance values of the first and second LC networks 108, 118 can be adjusted to maximize the power transfer between the circuit board 202 and the device package 204. Conventionally, maximum power transfer is only attained at one frequency, as the impedance values for the matching networks of the circuit board and the packaged amplifier circuit are fixed. The disclosed circuits and techniques overcome this problem by making the impedance values of the amplifier circuit 100 adjustable. As a result, a single circuit board 202 and single device package 204 (which includes the RF amplifier 102) can be used to provide amplifiers that operate at different frequencies in a wideband frequency range without compromising the power efficiency of the circuit across the wideband frequency range.

Terms such as "same," "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like, are used to describe various elements, regions, sections, etc. and are also not intended to be limiting. Like terms refer to like elements throughout the description.

The term "directly electrically connected" or "electrically connected" describes a permanent low-ohmic connection between electrically connected elements, for example a wire connection between the concerned elements. By contrast, the term "electrically coupled" means that one or more intervening element(s) configured to influence the electrical signal in some tangible way is be provided between the electrically coupled elements. These intervening elements include active elements, such as transistors, as well as passive elements, such as inductors, capacitors, diodes, resistors, etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An RF assembly, comprising:
 a circuit board comprising an impedance matching network;
 a device package mounted on the circuit board and comprising:
  an RF amplifier configured to amplify an RF signal as between an input terminal and an output terminal of the RF amplifier across a wideband frequency range;
 a first LC network connected to the input terminal and comprising first and second reactive components;
 a second LC network connected to the output terminal and comprising third and fourth reactive components;
 a first package lead connecting the input terminal to the circuit board;
 a second package lead connecting the output terminal to the circuit board;
 a first switching device configured to select an impedance of the first LC network between a first impedance value and a second impedance value; and
 a second switching device configured to select an impedance of the second LC network between a third impedance value and a fourth impedance value;
 wherein the impedance matching network is connected to the first package lead or the second package lead,
 wherein the first switching device is controllable via a DC bias that is applied on top the RF signal at the first package lead, and wherein the second switching device is controllable via a second DC bias that is applied on top the RF signal at the second package lead.

2. The RF assembly of claim 1, wherein the first switching device couples both the first and second reactive components to the input terminal in an ON state, wherein the first switching device disconnects the second reactive component from the input terminal in an OFF state, wherein the second switching device couples both the third and fourth reactive components to the output terminal in an ON state, and wherein the second switching device disconnects the second reactive component from the input terminal in an OFF state.

3. The RF assembly of claim 1, wherein the first and second switching devices are disposed in the device package.

4. The RF assembly of claim 1, wherein the impedance matching network is connected to the second package lead, wherein the impedance matching network has a fixed impedance value.

5. The RF assembly of claim 4, wherein the circuit board comprises first and second impedance matching networks, wherein the first impedance matching network is connected to the first package lead, and wherein the second impedance matching network is connected to the second package lead.

6. The RF assembly of claim 4, wherein the third impedance value of the second LC network and the fixed impedance value are matched for peak efficiency at a first frequency, and wherein the fourth impedance value of the second LC network and the fixed impedance value are matched for peak efficiency at a second frequency.

7. The RF assembly of claim 4, wherein the first frequency is 1.8 GHz and wherein the second frequency is 2.2 GHz.

8. A method of operating an amplifier circuit, comprising:
providing an RF assembly comprising: a circuit board comprising an impedance matching network and a device package mounted on the circuit board, the device package comprising an RF amplifier configured to amplify an RF signal as between an input terminal and an output terminal of the RF amplifier across a wideband frequency range; a first LC network connected to the input terminal and comprising first and second reactive components; a second LC network connected to the output terminal and comprising third and fourth reactive components; a first package lead connecting the input terminal to the circuit board; a second package lead connecting the output terminal to the circuit board; a first switching device configured to select an impedance of the first LC network between a first impedance value and a second impedance value; and a second switching device configured to select an impedance of the second LC network between a third impedance value and a fourth impedance value, wherein the impedance matching network is connected to the first package lead or the second package lead;
using the RF amplifier to amplify an RF signal as between the input terminal and the output terminal across a wideband frequency range;
selecting an impedance value of the first LC network between a first impedance value and a second impedance value; and
selecting an impedance value of the second LC network between a third impedance value and a fourth impedance value,
wherein selecting the impedance value of the first LC network comprises controlling an ON/OFF state of a first switching device via a DC bias that is applied on top of the RF signal at the first package lead, and
wherein selecting the impedance value of the second LC network comprises controlling an ON/OFF state of a second switching device via a second DC bias that is applied on top of the RF signal at the second package lead.

9. The method of claim 8, wherein selecting the impedance value of the first LC network comprises coupling first and second reactive components to the input terminal in the ON state of the first switching device and disconnecting the second reactive component from the input terminal in an in the OFF state of the first switching device, and wherein selecting the impedance value of the second LC network comprises coupling third and fourth reactive components to the output terminal in the ON state of the second switching device and disconnecting the fourth reactive component from the output terminal in an in the OFF state of the second switching device.

10. The method of claim 9, wherein each of the first, second, third and fourth reactive components are capacitors, wherein coupling the first and second reactive components to the input terminal in the ON state of the first switching device comprises coupling the first and second reactive components in parallel with one another, and wherein coupling the third and fourth reactive components to the output terminal in the ON state of the second switching device comprises coupling the third and fourth reactive components in parallel with one another.

11. The method of claim 8, wherein the wideband frequency range spans from a lower first frequency value to a higher second frequency value, wherein selecting the impedance value of the first LC network comprises setting the impedance of the first LC network to the first impedance value when the RF amplifier is operating at the first frequency value and to the second impedance value when the when the RF amplifier is operating at the second frequency value, and wherein selecting the impedance value of the second LC network comprises setting the impedance of the second LC network to the third impedance value when the RF amplifier is operating at the first frequency value and to the fourth impedance value when the when the RF amplifier is operating at the second frequency value.

12. The method of claim 8, wherein the first LC network resonates with the first frequency value at the first impedance value and resonates with the second frequency value at the second impedance value, and wherein the second LC network resonates with the first frequency value at the third impedance value and resonates with the second frequency value at the fourth impedance value.

13. The method of claim 8, wherein the output terminal is connected to the impedance matching network, the method further comprising:
selecting, via the circuit board, an impedance value of the second LC network that corresponds to a peak efficiency impedance between the second LC network and the impedance matching network at the first frequency value or the second frequency value.

* * * * *